United States Patent
Hou

(10) Patent No.: US 7,128,947 B2
(45) Date of Patent: Oct. 31, 2006

(54) PRE-TREATING METHOD FOR PLATING A FE-MN-AL ALLOY SURFACE

(76) Inventor: Wen-Ching Hou, No. 28, Lane 122, Hsin-Chang St., Nantz Dist., Kaohsiung (TW)

( * ) Notice: Subject to any disclaimer, the term of this patent is extended or adjusted under 35 U.S.C. 154(b) by 157 days.

(21) Appl. No.: 10/888,018

(22) Filed: Jul. 12, 2004

(65) Prior Publication Data

US 2006/0006072 A1 Jan. 12, 2006

(51) Int. Cl.
*B05D 3/12* (2006.01)
*B05D 1/18* (2006.01)
(52) U.S. Cl. ............... 427/327; 427/435; 427/436; 427/437
(58) Field of Classification Search ............... 427/327, 427/435, 436, 437
See application file for complete search history.

(56) References Cited

U.S. PATENT DOCUMENTS

2005/0221008 A1* 10/2005 Byrne et al. ............... 427/299

FOREIGN PATENT DOCUMENTS

TW 460591 10/2001

* cited by examiner

*Primary Examiner*—Edna Wong
(74) *Attorney, Agent, or Firm*—Birch, Stewart, Kolasch & Birch, LLP

(57) ABSTRACT

A pre-treating method for plating a Fe—Mn—Al alloy surface includes the steps of: cleaning a Fe—Mn—Al alloy surface with ultrasonic energy; heat-degreasing the Fe—Mn—Al alloy surface with a basic solution for removing accumulated grease; deterging the Fe—Mn—Al alloy surface with an acid solution for eliminating corrosion produced in previous high temperature conditions; electrolyzing the Fe—Mn—Al alloy surface with a basic solution for removing an oxidative layer; and neutralizing the basic solution remained on the Fe—Mn—Al alloy surface with an acid solution; and plating the Fe—Mn—Al alloy surface with corrosion-resisting materials.

20 Claims, 2 Drawing Sheets

PRE-TREATING METHOD FOR PLATING A FE-MN-AL ALLOY SURFACE

BACKGROUND OF THE INVENTION

1. Field of the Invention

The present invention relates to a pre-treating method for plating a Fe—Mn—Al alloy surface. More particularly, the present invention relates to a pre-treating method for activating a Fe—Mn—Al alloy surface by means of cleaning with a high-concentrated basic solution and vibrating with ultrasonic engergy that may enhance adhesion of the Fe—Mn—Al alloy surface for plating.

2. Description of the Related Art

Generally, nickel and chromium components contained in stainless steel are always rare and costly so Fe—Mn—Al alloy has replaced stainless steel. In mining industry, nickel and chromium are inexpensive and abundant in nature, and it is intended to replace nickel and chromium with manganese and aluminum respectively.

In metallurgical industry, chromium element is capable of enhancing corrosion-resisting ability of stainless steel. Generally, stainless steel contains more than about 12% in weight of chromium that may form an oxidative layer to resist further oxidation.

Taiwanese Pat. Appl. Ser. No. 89121645 titled "low-density high-ductility iron-base alloy for a golf club head" discloses Fe—Mn—Al alloy having poor corrosion-resisting ability. In 5percent salt moisture testing standard, Fe—Mn—Al alloy containing chromium less than 5.5% in weight performs poor corrosion-resisting and cannot pass. On the contrary, Fe—Mn—Al alloy containing chromium more than 9.0% in weight may improve corrosion-resisting ability but it performs with high brittleness and poor ductility that deteriorates mechanical characteristic. In the light of this task, it is hard that Fe—Mn—Al alloy contains adequate chromium for improving corrosion-resisting ability. In order to maintain desired mechanical characteristic, it is necessary that a Fe—Mn—Al alloy surface must require plating for corrosion resisting.

In manufacturing a golf club head, Fe—Mn—Al alloy has highly low density, excellent vibration-absorbability and high degree of hardness. Casting a golf club head with Fe—Mn—Al alloy, the center of gravity of the golf club head may be lowered, and a striking surface area and dimensions of the golf club head may be increased. In use, inevitably, the golf club head made of Fe—Mn—Al alloy has poor corrosion resisting. To avoid rustiness or corrosion, there is a cladding material on the surface of the golf club head to reduce the possibility of rusting. In order to improve plating quality, there is a need for a series of preparing steps for pre-treating the golf club head. Consequently, it can insure a plating layer to securely adhere to the surface of the golf club head and to avoid peeling off therefrom.

Referring initially to FIG. 1, it illustrates a pre-treating method for plating an alloy surface. The pre-treating method includes the steps consisting of an ultrasonic energy cleaning step, a degreasing step, a deterging step, an electrolysis step, an activating step and a plating step.

In ultrasonic energy cleaning step, the alloy surface is cleaned with ultrasonic energy for preliminary removing larger grime.

In degreasing step, the alloy surface is subsequently treated with a chemical solution, such as sodium hydroxide, and soaked in the chemical solution for two minutes for removing accumulated grease. Then, the alloy surface is further cleaned in water.

In deterging step, the alloy surface is subsequently treated with an acid solution, such as 5%–30% of hydrochloric acid, for eliminating corrosion produced in previous high temperature conditions. Then, the alloy surface is further cleaned in water.

In electrolysis step, the alloy surface is subsequently treated with anodic electrolysis, such as 5%–90% of sulfuric acid in current density of 5–40 A/dm$^2$, for removing an oxidative or inactive layer. Then, the alloy surface is further cleaned in water.

In activating step, the alloy surface is subsequently treated with an acid solution, such as 15 g/l–150 g/l of hydrochloric acid or sulfuric acid, for activating. Then, the alloy surface is further cleaned in water.

In plating step, the alloy surface is finally plated with corrosion-resisting metal.

The above-mentioned method is widely used and suitable for treating alloy steel or low-carbon steel. However, the above-mentioned method is unable to enhance adhesion of the plating layer to a Fe—Mn—Al alloy surface, and unsuitable for treating Fe—Mn—Al alloy. In electrochemical analysis, aluminum element contained in Fe—Mn—Al alloy is highly activated and easily oxidized to inactivate the Fe—Mn—Al alloy surface. In electrolysis step, when the Fe—Mn—Al alloy surface is treated with anodic electrolysis for removing an oxidative layer, aluminum element contained in Fe—Mn—Al alloy is soaked in a high-concentrated acid solution, and then an electric current is conducted in the acid solution. At this time, not only the original oxidative layer ($Al_2O_3$) may be remained on the Fe—Mn—Al alloy surface, but also more oxidative layers reacted with aluminum elements may be precipitated on the Fe—Mn—Al alloy surface. Consequently, the Fe—Mn—Al alloy surface is inactivated and unfavorable for plating process. Hence, there is a need for an improved pre-treating method for plating a Fe—Mn—Al alloy surface.

The present invention intends to provide a pre-treating method for plating a Fe—Mn—Al alloy surface which includes ultrasonic energy cleaning step, heat-degreasing step, ultrasonic energy deterging step and basic electrolysis step. In ultrasonic energy deterging step, the Fe—Mn—Al alloy surface is treated with a high-concentrated basic solution for removing an oxidative layer, and ultrasonic energy for speeding activation. Thereby, the Fe—Mn—Al alloy surface can provide activity and avoid inactivity for improving adhesion of a cladding material that may enhance plating quality and corrosion-resisting ability.

SUMMARY OF THE INVENTION

The primary objective of this invention is to provide a pre-treating method for plating a Fe—Mn—Al alloy surface which is treated with a basic solution for removing an oxidative layer, and ultrasonic energy for speeding activation. Consequently, it can improve adhesion of a cladding material that may enhance plating quality and corrosion-resisting ability.

The secondary objective of this invention is to provide the pre-treating method for plating a Fe—Mn—Al alloy surface that improves adhesion of a plating layer to a golf club head. Consequently, it may enhance plating quality and corrosion-resisting ability of the golf club head.

The pre-treating method for plating a Fe—Mn—Al alloy surface in accordance with the present invention includes the steps of: cleaning a Fe—Mn—Al alloy surface with ultrasonic energy; heat-degreasing the Fe—Mn—Al alloy surface with a basic solution for removing accumulated grease;

deterging the Fe—Mn—Al alloy surface with an acid solution for eliminating corrosion produced in previous high temperature conditions; electrolyzing the Fe—Mn—Al alloy surface with a basic solution for removing an oxidative layer; and neutralizing the basic solution remained on the Fe—Mn—Al alloy surface with an acid solution; and plating the Fe—Mn—Al alloy surface with corrosion-resisting materials.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

Figure 2:
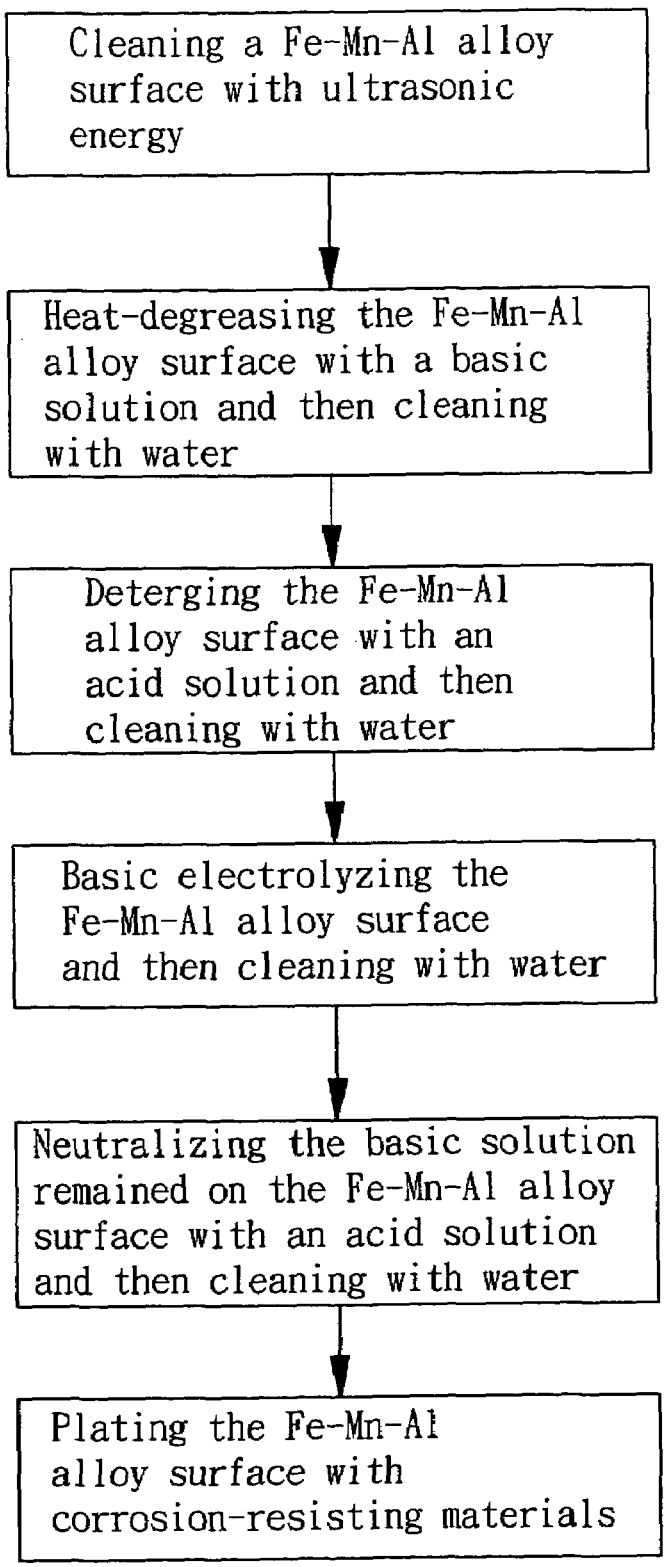
FIG. 2 is an enlarged cross-sectional view, in FIG. 1, of a pre-treating method for plating a Fe—Mn—Al alloy surface in accordance with a preferred embodiment of the present invention.

Referring to FIG. 2, a pre-treating method for plating a Fe—Mn—Al alloy surface in accordance with a preferred embodiment of the present invention is applied to manufacture a golf club head.

Referring again to FIG. 2, the pre-treating method includes a first step that employs ultrasonic energy for cleaning the Fe—Mn—Al alloy surface of the golf club head. In ultrasonic energy cleaning step, the Fe—Mn—Al alloy surface of the golf club head is placed in an ultrasonic machine and treated with high frequency ultrasonic waves for removing larger grime. In the ultrasonic machine, the entire Fe—Mn—Al alloy surface of the golf club head is soaked in a solution selected from a group consisting of soften water, alcohol and an organic solvent—methanol, ethanol, methyl benzene, acetone or bromine propane for example. Preferably, the ultrasonic machine generates ultrasonic waves in frequency ranging from 16 kHz to 60 kHz to vibrate the solution. The ultrasonic energy cleaning step can preliminary remove larger grime accumulated on the Fe—Mn—Al alloy surface.

The pre-treating method includes a second step that employs ultrasonic energy and a basic solution for heat-degreasing the Fe—Mn—Al alloy surface. In heat-degreasing step subsequent to ultrasonic energy cleaning step, the Fe—Mn—Al alloy surface is soaked in the basic solution which transmits ultrasonic waves generated from the ultrasonic machine to vibrate the basic solution. Preferably, a frequency of the ultrasonic wave ranges between 16 kHz and 60 kHz. More preferably, the basic solution is heated to a temperature ranging from 40 degrees centigrade to 85 degrees centigrade and has a concentration ranging between about 30 percent and 85 percent. More preferably, the basic solution is selected from a group consisting of sodium hydroxide, sodium carbonate, sodium silicate, sodium phosphate, sodium bicarbonate, sodium sulfate, sodium phosphite and mixtures thereof. More preferably, the basic solution is added a desired surfactant-anionics or non-ionics. In electrochemistry, a high-concentrated basic solution is able to remove an oxidative layer ($Al_2O_3$) and grease, and to activate the Fe—Mn—Al alloy surface. Meanwhile, the ultrasonic energy is able to speed reactive rate of activating. Accordingly, the ultrasonic energy can maintain activation of the Fe—Mn—Al alloy surface to avoid inactivation that may improve adhesion of a cladding material and plating quality. To solve the high-concentrated basic solution and ultrasonic energy causing a pitting effect on the Fe—Mn—l alloy surface, the processing time for the heat-degreasing step ranges between 5 mm and 15 mm that can avoid excessive corrosion aluminum elements in the Fe—Mn—Al alloy surface. Then, the Fe—Mn—Al alloy surface is further cleaned in water.

The pre-treating method includes a third step that employs an acid solution for eliminating corrosion produced in previous high temperature conditions in tempering. In deterging step subsequent to heat-degreasing step, the Fe—Mn—Al alloy surface is soaked in the acid solution for eliminating metal oxide, metal hydroxide and metal salts. Preferably, the acid solution is heated to a temperature ranging from 40 degrees centigrade to 80 degrees centigrade and has a concentration ranging between about 5 percent and 30 percent. More preferably, the acid solution is selected from a group consisting of hydrochloric acid, sulfuric acid, nitric acid, phosphoric acid, hydrofluoric acid and mixtures thereof. An ultrasonic machine is applied to vibrate the acid solution for speeding the processing time. Preferably, a frequency of the ultrasonic wave ranges between 16 kHz and 60 kHz. To avoid an excessive soakage causing a pitting and discoloring effect on the Fe—Mn—Al alloy surface, the processing time for the deterging step ranges between 2 mm and 30 mm. Then, the Fe—Mn—Al alloy surface is further cleaned in water.

The pre-treating method includes a fourth step that employs electrolysis for removing a remained oxidative layer and grease, and reactivating the Fe—Mn—Al alloy surface. In electrolysis step subsequent to deterging step, the Fe—Mn—Al alloy surface is placed in an electrobath for selectively treating with anodic or cathodic electrolysis. Preferably, a basic solution is used for electrolysis and has a concentration ranging between about 20 percent and 80 percent. More preferably, the basic solution is selected from a group consisting of sodium hydroxide, sodium carbonate, sodium silicate, sodium phosphate, sodium bicarbonate, sodium sulfate, sodium phosphite and mixtures thereof. More preferably, the basic solution is added a desired surfactant-anionics or non-ionics. More preferably, the basic solution is heated to a temperature ranging from 40 degrees centigrade to 85 degrees. The Fe—Mn—Al alloy surface connected to a cathode generates reaction gas so as to remove oxidative layers, grease and impurities after conducting an electric current. To avoid an excessive corrosion of aluminum elements causing a pitting and discoloring effect on the Fe—Mn—Al alloy surface, the processing time for the electrolysis step ranges between 0.5 mm and 2 mm. Then, the Fe—Mn—Al alloy surface is further cleaned in water.

The pre-treating method includes a fifth step that employs an acid solution for neutralizing the basic solution remained on the Fe—Mn—Al alloy surface so as to avoid excessive corrosion causing a pitting effect. In neutralizing step subsequent to electrolysis step, the Fe—Mn—Al alloy surface is soaked in the acid solution for less than 60 second. Preferably, the acid solution has a concentration less than 10 percent, and is selected from a group consisting of hydrochloric acid, sulfuric acid, nitric acid, phosphoric acid, hydrofluoric acid and mixtures thereof. Then, the Fe—Mn—Al alloy surface is further cleaned in water.

The pre-treating method includes a sixth step that employs a corrosion-resisting metal for plating the Fe—Mn—Al alloy surface. In plating step subsequent to neutralizing step, the Fe—Mn—Al alloy surface is treated with an appropriated plate method selected from metal electroplating, electroless plating, physical vapor deposition or ion plating. Generally, the Fe—Mn—Al alloy surface is plated with chromium. Ordinarily, the Fe—Mn—Al alloy surface is firstly plated with nickel by metal electroplating or electroless plating to form a prime-plating layer. The prime-plating layer of nickel may improve adhesion of the Fe—Mn—Al alloy surface for plating chromium. In addition to nickel and chromium, the Fe—Mn—Al alloy surface is further plated with other metal selected from a group consisting of zinc, copper, magnesium, titanium, gold, silver, platinum and cobalt.

Figure 1:
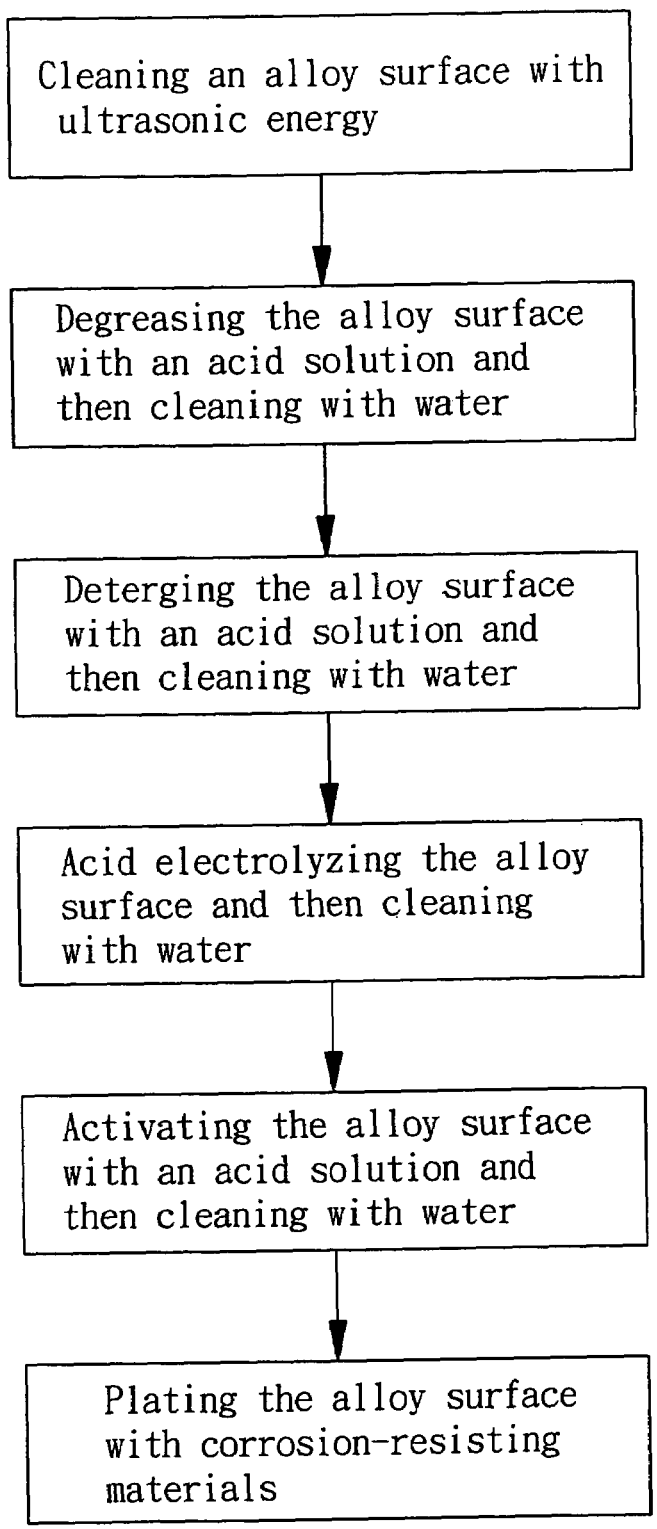
FIG. 1 is a block diagram of a pre-treating method for plating an alloy surface in accordance with the prior art.

Referring back to FIG. 1, the conventional pre-treating method is unable to enhance adhesion of the plating layer to a Fe—Mn—Al alloy surface, and unsuitable for treating Fe—Mn—Al alloy. In electrolysis step, anodic electrolysis cannot remove an oxidative layer of the Fe—Mn—Al alloy surface and, on the contrary, generate more oxidative layers precipitated on the Fe—Mn—Al alloy surface. By contrast, referring again to FIG. 2, the pre-treating method in accordance with the present invention treats the Fe—Mn—Al alloy surface with the high-concentration basic solution for removing the oxidative layer. Consequently, it can enhance adhesion of the plating layer to the Fe—Mn—Al alloy surface that may improve plating quality and useful life of the golf club head.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A pre-treating method for a Fe—Mn—Al alloy surface, comprising the steps of:
   cleaning the Fe—Mn—Al alloy surface with a solution;
   degreasing and activating the cleaned Fe—Mn—Al alloy surface with a first basic solution for removing accumulated grease;
   electrolyzing and reactivating the degreased and activated Fe—Mn—Al alloy surface with a second basic solution for removing an oxidative layer; and
   plating the electrolyzed and reactivated Fe—Mn—Al alloy surface with corrosion-resisting materials.

2. The pre-treating method for the Fe—Mn—Al alloy surface as defined in claim 1, wherein the first basic solution is selected from the group consisting of sodium hydroxide, sodium carbonate, sodium silicate, sodium phosphate, sodium bicarbonate, sodium sulfate, sodium phosphite and mixtures thereof.

3. The pre-treating method for the Fe—Mn—Al alloy surface as defined in claim 1, wherein the first basic solution is heated to speed removal of the grease.

4. The pre-treating method for the Fe—Mn—Al alloy surface as defined in claim 2, wherein the first basic solution has a concentration ranging between 30 percent and 85 percent.

5. The pre-treating method for the Fe—Mn—Al alloy surface as defined in claim 3, wherein the first basic solution is heated to a temperature ranging from 40 degrees centigrade to 85 degrees centigrade.

6. The pre-treating method for the Fe—Mn—Al alloy surface as defined in claim 1, wherein the second basic solution is selected from the group consisting of sodium hydroxide, sodium carbonate, sodium silicate, sodium phosphate, sodium bicarbonate, sodium sulfate, sodium phosphite and mixtures thereof.

7. The pre-treating method for the Fe—Mn—Al alloy surface as defined in claim 6, wherein the second basic solution has a concentration ranging between 20 percent and 80 percent.

8. The pre-treating method for the Fe—Mn—Al alloy surface as defined in claim 1, wherein the second basic solution is heated for speeding the reactivation of the Fe—Mn—Al alloy surface.

9. The pre-treating method for the Fe—Mn—Al alloy surface as defined in claim 8, wherein the second basic solution is heated to a temperature ranging from 40 degrees centigrade to 85 degrees centigrade.

10. The pre-treating method for the Fe—Mn—Al alloy surface as defined in claim 1, wherein the Fe—Mn—Al alloy surface is soaked in the first basic solution, and treated with ultrasonic energy.

11. The pre-treating method for the Fe—Mn—Al alloy surface as defined in claim 1, wherein the step of degreasing and activating comprises treating the cleaned Fe—Mn—Al alloy surface with ultrasonic energy for 5 mm to 15 mm.

12. The pre-treating method for the Fe—Mn—Al alloy surface as defined in claim 1, wherein the solution for cleaning the Fe—Mn—Al alloy surface is an organic solvent.

13. The pre-treating method for the Fe—Mn—Al alloy surface as defined in claim 1, wherein, subsequent to degreasing the cleaned Fe—Mn—Al alloy surface, the degreased and activated Fe—Mn—Al alloy surface is deterged with an acid solution for eliminating metal oxide, metal hydroxide and metal salts.

14. The pre-treating method for the Fe—Mn—Al alloy surface as defined in claim 13, wherein the acid solution is heated for speeding a processing time.

15. The pre-treating method for the Fe—Mn—Al alloy surface as defined in claim 13, wherein the acid solution is selected from the group consisting of hydrochloric acid, sulfuric acid, nitric acid, phosphoric acid, hydrofluoric acid and mixtures thereof.

16. The pre-treating method for the Fe—Mn—Al alloy surface as defined in claim 1, wherein, subsequent to electrolyzing the degreased and activated Fe—Mn—Al alloy surface with the second basic solution, the second basic solution remaining on the degreased and activated Fe—Mn—Al alloy surface is neutralized with an acid solution.

17. The pre-treating method for the Fe—Mn—Al alloy surface as defined claim 16, wherein the acid solution has a concentration less than 10 percent.

18. The pre-treating method for the Fe—Mn—Al alloy surface as defined in claim 16, wherein the acid solution is selected from the group consisting of hydrochloric acid, sulfuric acid, nitric acid, phosphoric acid, hydrofluoric acid and mixtures thereof.

19. The pre-treating method for the Fe—Mn—Al alloy surface as defined in claim 1, wherein the Fe—Mn—Al alloy surface is cleaned further with ultrasonic energy.

20. The pre-treating method for the Fe—Mn—Al alloy surface as defined in claim 1, wherein the Fe—Mn—Al alloy surface is provided on a golf club head.

* * * * *